(12) United States Patent
Lin et al.

(10) Patent No.: US 11,733,429 B2
(45) Date of Patent: Aug. 22, 2023

(54) CONTROLLED DESIGN OF LOCALIZED STATES IN PHOTONIC QUASICRYSTALS

(71) Applicant: THE TRUSTEES OF PRINCETON UNIVERSITY, Princeton, NJ (US)

(72) Inventors: Chaney Lin, San Francisco, CA (US); Paul J. Steinhardt, Princeton, NJ (US); Salvatore Torquato, Princeton, NJ (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 240 days.

(21) Appl. No.: 17/049,829

(22) PCT Filed: Apr. 23, 2019

(86) PCT No.: PCT/US2019/028776
§ 371 (c)(1),
(2) Date: Oct. 22, 2020

(87) PCT Pub. No.: WO2019/209864
PCT Pub. Date: Oct. 31, 2019

(65) Prior Publication Data
US 2021/0072424 A1    Mar. 11, 2021

Related U.S. Application Data

(60) Provisional application No. 62/662,489, filed on Apr. 25, 2018.

(51) Int. Cl.
*G02B 1/00*        (2006.01)
(52) U.S. Cl.
CPC .................................. *G02B 1/005* (2013.01)

(58) Field of Classification Search
CPC ...... G02B 6/1225; G02B 1/005; C30B 29/60; C30B 29/00; B82Y 20/00; G02F 2202/32
See application file for complete search history.

(56) References Cited

U.S. PATENT DOCUMENTS

| | | | |
|---|---|---|---|
| 2007/0119522 A1* | 5/2007 | Grier ..................... | B82Y 20/00 148/403 |
| 2014/0051820 A1* | 2/2014 | Steinhardt .............. | B82Y 30/00 526/306 |
| 2019/0041548 A1* | 2/2019 | Florescu .................. | C01F 7/02 |

OTHER PUBLICATIONS

Wang, "Light localization in photonic band gaps of quasiperiodic dielectric structures", Phys. Rev. B 82, 045119. (Year: 2010).*
Vardeny, "Optics of photonic quasicrystals", Nature Photonics 7, 177 (Year: 2013).*
Altug, H. et al. (2006) "Ultrafast photonic ciystal nanocavity laser," *Nature Physics* 2, 484.
Chan, Y. S. et al. (1998) "Photonic Band Gaps in Two Dimensional Photonic Quasiciystals," *Physical Review Letters* 80(5), 956-959.
De Bruijn, N. G. (1981) "Lambda calculus notation with nameless dummies, a tool for automatic formula manipulation, with application to the Church-Rosser theorem," *Indagationes Mathematicae (Proceedings)* 84, 39.
De Bruijn, N. G. (1981) "Algebraic theory of Pemose's non-periodic tilings of the plane. II," *Indagationes Mathematicae (Proceedings)* 84(1), 53-66.

(Continued)

*Primary Examiner* — Michael H Caley
*Assistant Examiner* — Jonathan Y Jung
(74) *Attorney, Agent, or Firm* — Medlen & Carroll, LLP

(57) ABSTRACT

This invention relates generally to the field of quasicrystalline structures.

7 Claims, 15 Drawing Sheets

(56) References Cited

OTHER PUBLICATIONS

El-Kady, I. et al. (2006) "Application of photonic crystals in submicron damage detection and quantification," *Applied Physics Letters* 88(25), 253109.
Entin-Wohlman, O. et al. (1988) "Pemose tiling appro ximants," *Journal of Physics France* 49(4), 587-598.
Florescu, M. et al. (2009) "Complete band gaps in two-dimensional photonic quasicrystals," *Physical Review B* 80(15), 155112.
Gardner, M. (1972) "Mathematical Games," *Scientific American* 226, 115.
Ingersent, K. et al. (1990) "Matching rules and growth rules for pentagonal quasicrystal tilings," *Physical Review Letters* 64(12), 2034-2037.
Joannopoulos, J. D. et al. (2011) *Photonic Crystals: Molding the Flow of Light*, Princeton University Press.
Johnson, S. G. et al. (2001) "Block-iterative frequency-domain methods for Maxwell's equations in a planewave basis," *Optics Express* 8(3), 173-190.
Levine, D. et al. (1984) "Quasicrystals: A New Class of Ordered Structures," *Physical Review Letters* 53(26), 2477-2480.
Levine, D. et al. (1986) "Quasiciystals. I. Definition and structure," *Physical Review B* 34(2), 596-616.
Levitov, L. S. (1988) "Local rules forquasiciystals," *Communications in Mathematical Physics* 119, 627-666.
Lin, C. et al. (2017) "Corrigendum: Hyperuniformity variation with quasicrystal local isomorphism class," *Journal of Physics: Condensed Matter* 29(42), 479501.
Pavlovitch, A. et al. (1989) "Statistics of 'worms' in Pemose tilings," *Journal of Physics A: Mathematical and General* 22(20), 4347.
Rechtsman, M. C. et al. (2008) "Optimized Structures for Photonic Quasicrystals," *Physical Review Letters* 101(7), 073902.
Repetowicz, P. et al. (1998) "Exact eigenstates of tight-binding Hamiltonians on the Pemose tiling," *Physical Review B* 58(20), 13482-13490.
Socolar, J. E. S. et al. (1986) "Quasiciystals. II. Unit-cell configurations," *Physical Review B* 34(2), 617-647.
Socolar, J. E. S. et al. (1985) "Quasicrystals with arbitrary orientational symmetry," *Physical Review B* 32(8), 5547-5550.
Tokihiro, T. et al. (1988) "Exact eigenstates on a two-dimensional Pemose lattice and their fractal dimensions," *Physical Review B* 38(9), 5981-5987.
Vardeny, Z. V. et al. (2013) "Optics of photonic quasicrystals," *Nature Photonics* 7, 177.
Wang, K. (2006) "Lightwave states in two-dimensional quasiperiodic media," *Physical Review B* 73(23), 235122.
Wang, K. (2007) "Structural effects on light wave behavior in quasiperiodic regular and decagonal Pemose-tiling dielectric media: A comparative study," *Physical Review B* 76(8), 085107.
Wang, K. (2010) "Light localization in photonic band gaps of quasiperiodic dielectric structures," *Physical Review B* 82(4), 045119.
Zobetz, E. et al. (1990) "Vertex frequencies in generalized Penrose patterns," *Acta Crystallographica Section A* 46(12), 962-970.
PCT International Search Report of International Application No. PCT/US2019/028776 dated Aug. 7, 2019.

\* cited by examiner

CONTROLLED DESIGN OF LOCALIZED STATES IN PHOTONIC QUASICRYSTALS

CROSS-REFERENCE TO RELATED APPLICATIONS

The present application claims the benefit of U.S. Provisional Patent Application No. 62/662,489, filed on Apr. 25, 2018, which is incorporated herein by reference.

FIELD OF THE INVENTION

This invention relates generally to the field of quasicrystalline structures.

BACKGROUND OF THE INVENTION

Crystalline materials have long been exploited in many optical and electronic applications for physical properties arising from their crystalline symmetry. Although such crystalline materials allow many technological applications to be fulfilled, there are limitations imposed by such crystalline symmetry. The limited set of distinct symmetries available for crystalline arrangements require a very large contrast in dielectric constant to achieve a full photonic bandgap, and these symmetries result in optical materials whose optical properties are very sensitive to structural and chemical defects.

SUMMARY OF THE INVENTION

In one embodiment, the invention relates to a method for generating a (two and) three-dimensional dielectric quasicrystal heterostructure with a photonic bandstructure, comprising a) obtaining quasicrystal tilings, and b) generating a dielectric quasicrystal heterostructure from said quasicrystal tilings, wherein said dielectric quasicrystal heterostructure has a photonic bandstructure that contains degenerate, effectively localized states, lying inside a bandgap. In one embodiment, the tilings are (two dimensional) pentagonal quasicrystal tilings. In one embodiment, the tilings can be used to generate two-dimensional heterostructure or each tile can be extruded to form a prism resulting in a three-dimensional heterostructure. In one embodiment, said pentagonal quasicrystal tilings are obtained as direct projections using a rhombic-icosahedron window from a five-dimensional hypercubic lattice. In one embodiment, said quasicrystal tilings are obtained as duals to an overlapping set of five periodically spaced grids. In one embodiment, said dielectric quasicrystal heterostructure of step b) is generated without introducing defects into the heterostructure. In one embodiment, said degenerate, effectively localized states have precisely predictable and tunable properties. In one embodiment, said precisely predictable and tunable properties are selected from the group consisting of frequencies, frequency splittings, and spatial configurations.

In one embodiment, the invention relates to a three-dimensional dielectric quasicrystal heterostructure with a photonic bandstructure that contains degenerate, effectively localized states, lying inside a bandgap. In one embodiment, said quasicrystal heterostructure is defect-free.

In one embodiment, the invention relates to a method for generating two- and three-dimensional dielectric quasicrystal heterostructures with a controlled pre-selected bandgap properties, comprising a) generating a family of distinct defect-free quasicrystal patterns with a pre-selected symmetry; and b) generating a dielectric quasicrystal heterostructures from said quasicrystal patterns wherein the said dielectric quasicrystal heterostructures have photonic band structures photonic band gaps spanning pre-selected frequencies and localized states at pre-selected frequencies inside the bandgap. In one embodiment, the tilings are (two dimensional) pentagonal quasicrystal tilings. In one embodiment, the tilings can be used to generate two-dimensional heterostructure or each tile can be extruded to form a prism resulting in a three-dimensional heterostructure. In one embodiment, said pentagonal quasicrystal tilings are obtained as direct projections using a rhombic-icosahedron window from a five-dimensional hypercubic lattice. In one embodiment, said quasicrystal tilings are obtained as duals to an overlapping set of five periodically spaced grids. In one embodiment, said degenerate, effectively localized states have precisely predictable and tunable properties. In one embodiment, said precisely predictable and tunable properties are selected from the group consisting of frequencies, frequency splittings, and spatial configurations.

Definitions

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

A "photonic quasicrystal" means a quasicrystal that is capable of allowing the transmission, steering, manipulation, and control of some electromagnetic radiation. It is not intended that the term be limited to the transmission of electromagnetic radiation in the visible region. It is also not intended to be capable of transmitting of all electromagnetic radiation. In some preferred embodiments, the photonic quasicrystal refracts, reflects, defracts, or absorbs electromagnetic radiation at (some) individual frequencies. In preferred embodiments, the photonic quasicrystal refracts, reflects, defracts, or absorbs electromagnetic radiation at pre-selected frequencies.

A "heterostructure" means a dielectric structure with one or more interface(s) across which the chemical composition changes. The interface of the two dielectrics contains a scattering centre in which light propagates more slowly. If the scattering centers are regularly arranged in a medium, light is coherently scattered. In this case, interference causes some frequencies not to be allowed to propagate, giving rise to forbidden and allowed bands. Regions of frequency may appear that are forbidden regardless of the propagation direction. In some embodiments, "heterostructure" means a structure composed of two or more substances with different dielectric constants. The differences in dielectric constant are due to differences in chemical composition. In some embodiments, one of the substances is air or vacuum. Light propagates at different speeds in media with different dielectric constants. For some heterostructures, an electromagnetic radiation wave scatters from the interfaces between the substances. Interference among the scattered waves causes some frequencies not to be allowed to propagate, giving rise to forbidden and allowed frequency bands. For some frequency bands, propagation is forbidden regardless of the direction or polarization of the incoming electromagnetic wave.

A "photonic bandgap" material or structure means that for a certain range of wavelengths, no states exist in the structure for electromagnetic radiation to occupy. Electromagnetic radiation with these wavelengths is forbidden in the structure and cannot propagate. The presence of a single point defect, i.e., part of the structure in which the electromagnetic radiation can propagate, generally results in a "localized state", i.e., a tightly confined region of light energy which must stay within the defect, since it cannot propagate in the structure, and provided the energy is not being absorbed by the material. By introducing defects, one can introduce allowed energy levels in the gap. Defects, appropriately designed and arranged, can create waveguides with directional control (e.g., one micron radius, 90 degree bends with 98 percent transmission efficiency), drop/add filters, multiplexors/demultiplexors, resonators, and laser cavities. Alternatively, certain defect-free quasicrystal patterns have band gaps that include localized states in the band gap.

A "quasicrystalline lattice structure" means that the quasicrystal is in the form of material patterned with an open framework. For example, in preferred embodiments, the quasicrystal is made by stereolithography in which polymerization produces rhombic or rhombohedral cells characterized by rods that creates an open framework.

A "dielectric resonator" or "cavity" means a device arranged that allows electromagnetic radiation to propagate back and forth and build up intensity. An "optical resonator" or "resonant optical cavity" means an arrangement of optical components which allow a light beam to propagate back and forth and build up intensity. For example, if a mirror is partly transparent one can feed light from outside into the cavity. Two highly reflecting low-less reflectors may be positioned with their reflecting surfaces facing one another to form the cavity. A collimated laser beam enters the cavity and the wavelength of the incident light is rapidly swept in time. At specific wavelengths and at specific feature positions, light resonates within the cavity, building up energy, corresponding to a peak in the transmitted light.

"Visible spectrum" means electromagnetic radiation that ranges from approximately 780 nanometers (abbreviated nm) to approximately 380 nm. A regular incandescent bulb produces light within the visible spectrum. It also wastes a lot of its energy radiating invisible radiation, too. The photonic quasicrystal can be tailored so that it radiates almost all of its light in the desired visible with little (not really zero) waste. This is the reason for saying "substantially only" with regard to emitting light in the visible region.

An "interconnect" means a physical attachment between two or more objects.

A "preselectable rotational symmetry having a characteristic photonic bandgap structure forbidden in a crystalline material" means the structure has at least one five-, seven- or higher-fold symmetry axis and whose bandgap structure exhibits this same symmetry. For example, a photonic quasicrystal can have three-dimensional icosahedral symmetry or two dimensional seven-fold symmetry, either of which are impossible for photonic crystals.

As used herein, a material having a spherically symmetric property means that rotation by any angle in three dimensions produces no change with regard to the physical property. Circularly symmetric means that rotation about an axis by any angle (two dimensions) produces no change. Bandgaps are not precisely spherically symmetric (same for circularly symmetric); thus, usage is intended to be substantially so.

A "quasicrystalline structure includes higher point group symmetry than a crystalline counterpart" means that the quasicrystal can have five-, seven-, eight-, and higher-fold symmetry axes, whereas periodic crystals can never have greater five-fold symmetry or any symmetry greater than six-fold symmetry. For example, a crystal, planar hexagonal lattice has six-fold symmetry, the highest and most circular symmetry possible for a crystal or periodic pattern. Quasicrystals allow higher, more circular symmetries, such as patterns with seven-, eleven-, forty-seven- or even higher symmetries, Similarly in three-dimensions, the highest symmetry possible for a periodic pattern or crystal is cubic symmetry, whereas quasicrystals can have icosahedral symmetry, which includes five-fold symmetries and which is more spherically symmetric.

Quasicrystal patterns are classified according to rotational symmetry and "local isomorphism class" or "LI class." Two defect-free quasicrystal patterns in the same LI class are composed of the same units (e.g., tiles) such that every finite arrangement found in one pattern is found with the same frequency in the other and vice versa. Two defect-free quasicrystal patterns are in different LI classes if some finite arrangements of units (e.g. tiles) are in one pattern but not in the other, or vice versa. Defect-free quasicrystal patterns of a given symmetry and a given set of units, e.g., tile shapes, can be constructed in an infinite variety of distinct LI classes.

A "periodic approximant" is crystalline or periodic pattern whose unit cell or regularly repeating motif consists of a quasicrystal pattern of units e.g., tiles, slightly distorted so it can fit in a periodically repeating array. Approximants are a useful technical device for computing the properties of defect-free quasicrystals. Technically, the photonic properties of a quasicrystal pattern can be computed by first computing the properties for periodic approximants with repeating units containing increasing number of quasicrystal units, e.g., tiles, and determining the limit as the number of units gets large.

"Achieving higher power efficiency over a selected range of frequencies" means that more of the input power is converted into radiation of the desired frequencies and less is wasted in producing undesired: frequencies. For example, an ordinary microwave antenna also broadcasts near infrared and radio waves which are not useful for microwave transmission, but a quasicrystalline antenna would stop the unneeded waves and refocus their power towards producing more microwave radiation at the useful frequencies.

A "sub-wavelength quasicrystalline structure" means the spacing between the repeating elements in the quasicrystalline structure is smaller than the wavelength of the light.

A "stealth material" means a radar absorbent material that absorbs the incoming radar radiation without producing any reflections.

The term waveguide means any type of transmission line in the sense that it is used to guide electromagnetic radiation from one point to another. Typically, the transmission of electromagnetic energy along a waveguide travels at a velocity somewhat slower than electromagnetic radiation traveling through free space. A waveguide may be classified according to its cross section (rectangular, elliptical, or circular), or according to the material used in its construction (metallic or dielectric). Glass fibers, gas-filled pipes, and tubes with focusing lenses are examples of optical waveguides.

As used herein, the dielectric constant means the extent to which a substance concentrates the electrostatic lines of flux. The dielectric constant also determines the speed of light through the material or, equivalently, the refractive index. Substances with a low dielectric constant include a perfect vacuum, dry air, and most pure, dry gases such as helium and nitrogen. Materials with moderate dielectric constants include ceramics, distilled water, paper, mica, polyethylene, and glass. Metal oxides, in general, have high dielectric constants.

The refractive index is related to the dielectric constant of a material. The refractive' index (or index of refraction) of a material is the factor by which the phase velocity of electromagnetic radiation is slowed in that material, relative to its velocity in a vacuum. Although it is not intended that the invention be limited by any particular mechanism, it is believed that an electromagnetic wave's phase velocity is slowed in a material because the electric field creates a disturbance in the charges of each atom (primarily the electrons) proportional to the permittivity. The charges, in general, oscillate slightly out of phase with respect to the driving electric field. The charges thus radiate their own electromagnetic wave that is at the same frequency but with a phase delay. The macroscopic sum of all such contributions in the material is a wave with the same frequency but shorter wavelength than the original, leading to a slowing of the wave's phase velocity. Most of the radiation from oscillating material charges will modify the incoming wave, changing its velocity.

DESCRIPTION OF THE FIGURES

The accompanying figures, which are incorporated into and form a part of the specification, illustrate several embodiments of the present invention and, together with the description, serve to explain the principles of the invention. The figures are only for the purpose of illustrating a preferred embodiment of the invention and are not to be construed as limiting the invention.

Also labeled are the SVE types occurring within each range of γ. Green, solid regions at upper and lower ends represent the continuum of states adjacent to the bandgap. Note: γ=0 (Penrose LI class) has no SVEs and no corresponding effectively localized states.

Figure 7:
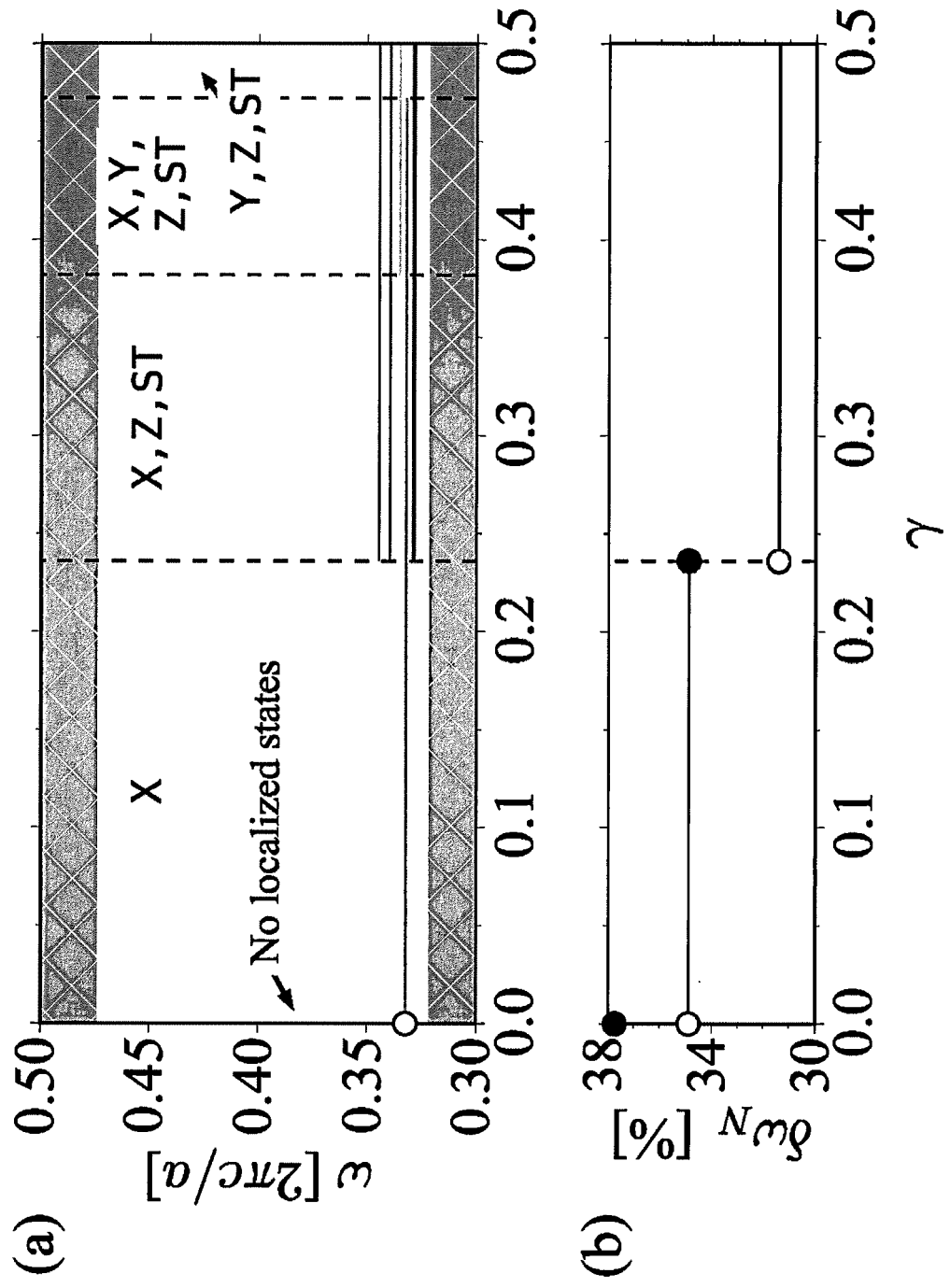
FIG. 7A shows expected TM spectrum around the fundamental bandgap versus LI class γ. Average frequencies of effectively localized states shown within each range of γ that their corresponding special vertex environments (SVEs) appear.

FIG. 7B shows the expected outer bandgap (ratio of frequency gap to the frequency at the midpoint of the gap) versus LI class γ.

Figure 8:
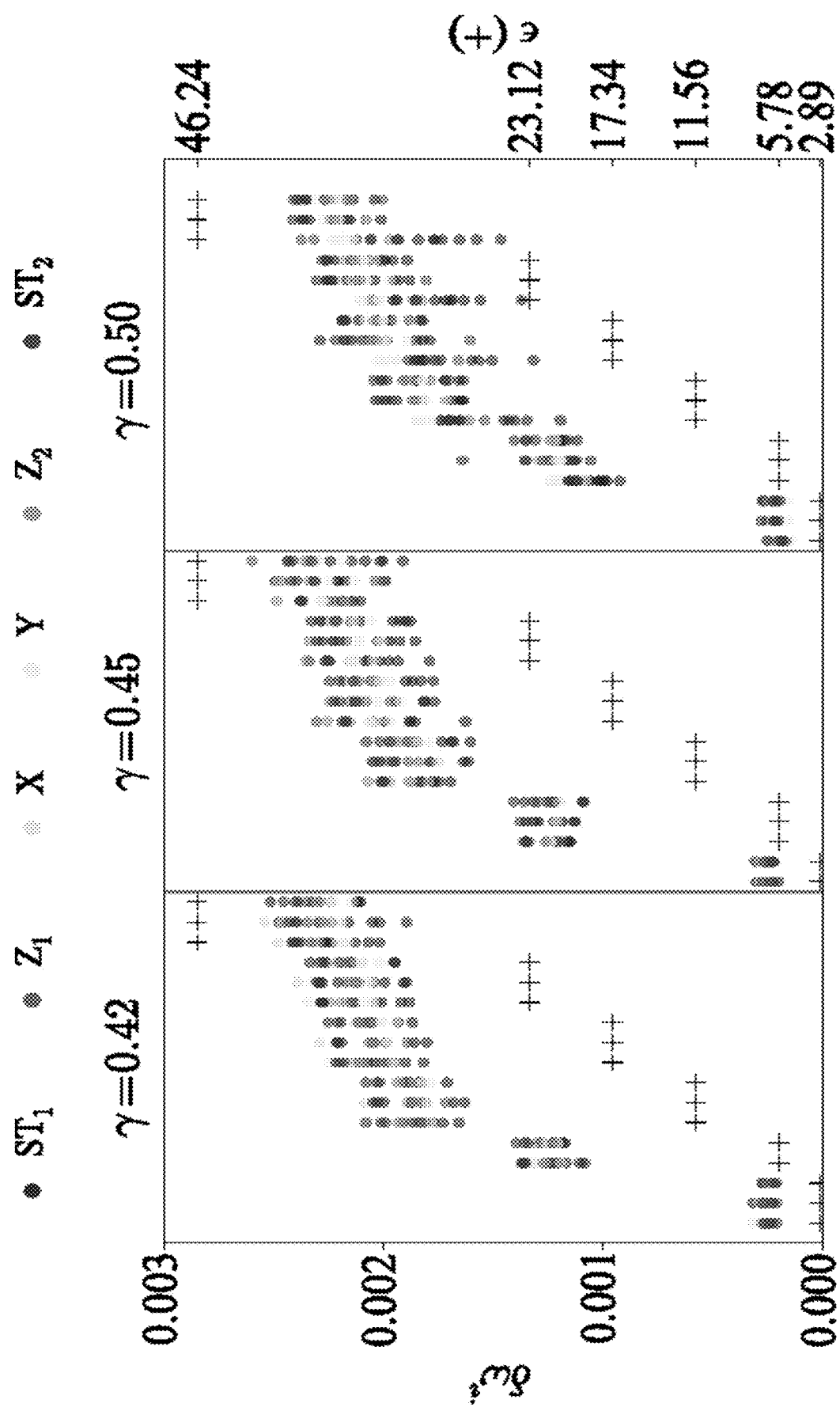

FIG. 8 shows estimating the uncertainty from resolution dω. For a fixed rendition from LI class γ and with dielectric constant E, the bandstructure is computed, first at 512×512 resolution, then at 1024×1024 resolution. The relative change in the frequencies δωi (defined in Equation 7) for states in the minibands is shown here (colored circles, left vertical axis). Each position along the horizontal axis corresponds to a fixed rendition from an LI class γ and with dielectric constant ε. The LI class is labeled above each subpanel. The dielectric constant is shown as a+, with values along the right vertical axis.

Figure 9:
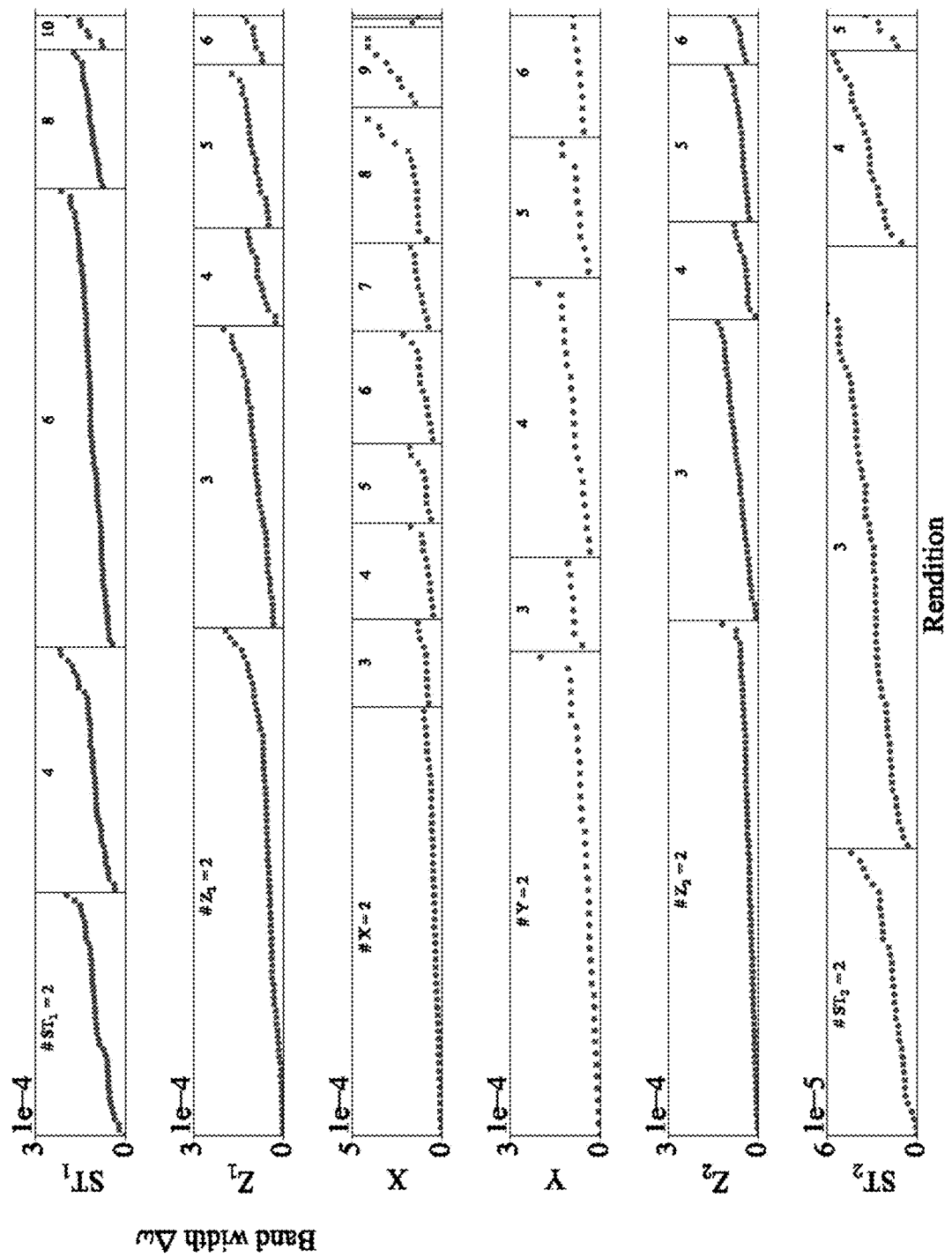

FIG. 9 shows Estimating band width Δω. For a fixed rendition from LI class γ, the bandstructure is computed. For each miniband, we compute the band width Δω (i.e., the difference between the maximum and minimum eigenfrequencies in the miniband). This is repeated for several renditions from four LI classes (γ=0.38, 0.42, 0.45, 0.50). Shown here are the band widths Δω. The different rows correspond to the different minibands. Each row has been divided into subpanels according to the number of SVE sites n of the miniband type (e.g., for the first row, n is the number of $ST_1$ sites and, for the second row, n is the number of $Z_1$ sites). The values of n are shown at the top of each subpanel. Within each subpanel, the renditions are ordered according to increasing Δω.

Figure 10:
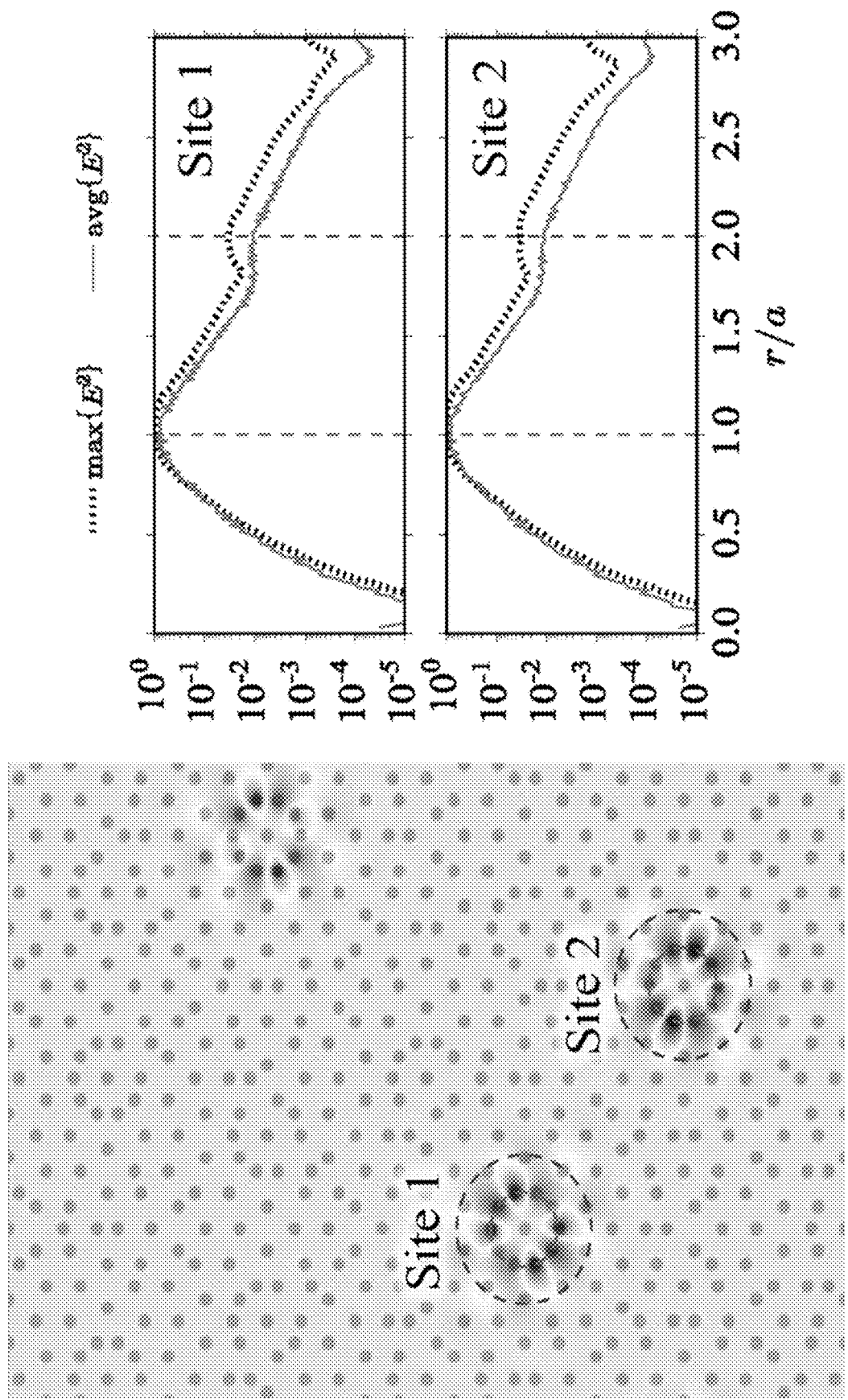

FIG. 10 shows Electric-field energy density $E^2$ of an $ST_1$ MS state versus distance r from central vertex of ST site. The distance r is in units of the tile edge length a. (Left) The electric field distribution in unit cell for an MS state from the $ST_1$ miniband, overlaid on the point pattern. Blue/red/white corresponds to negative/positive/zero field, respectively. (Upper Right) The maximum value of $E^2$ at distance r from Site 1 is shown as a red, solid line. This quantity is defined in Equation 11. The average value of $E^2$ at distance r from Site 1 is shown as a black, dotted line. This quantity is defined in Equation 12. Vertical dashed lines denote r/a=1

(green, dashed), which is where the first nearest neighbors are located, and r/a=2 (purple, dashed), which is roughly where the second nearest neighbors are located. Dashed circles with radii r/a=1, 2 and centered at Site 1 are shown in the Left panel. (Lower Right) Same quantities as plotted in the Upper Right panel but for Site 2.

Figure 11:
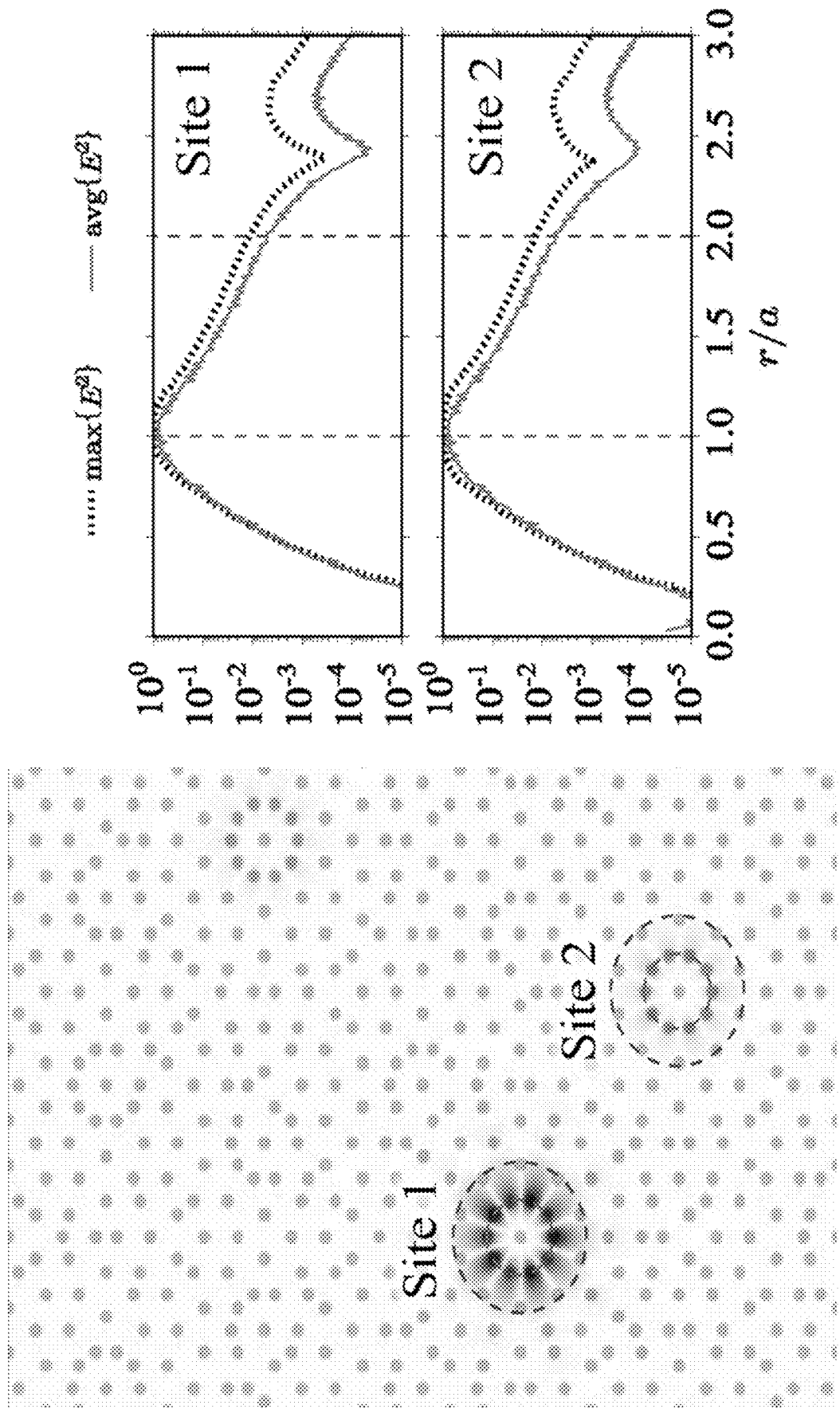

FIG. 11 shows Electric-field energy density $E^2$ of an $ST_2$ SS state versus distance r from central vertex of ST site. Quantities that are described in the FIG. 10 caption are presented here for an $ST_2$ SS state.

Figure 12:
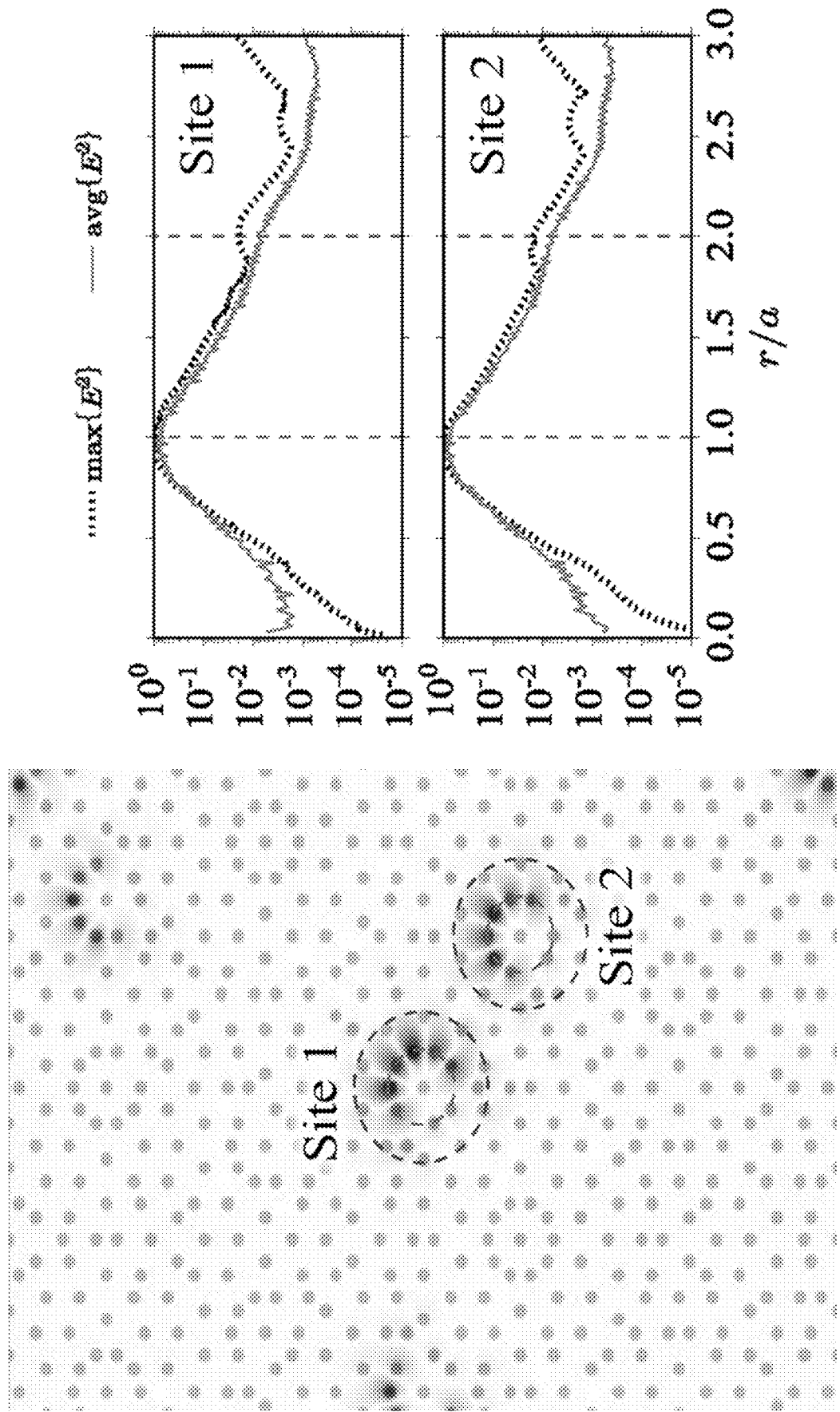

FIG. 12 shows Electric-field energy density $E^2$ of an X MS state versus distance r from central vertex of X site. Quantities that are described in the FIG. 10 caption are presented here for an X MS state.

FIGS. 13A&B shows SVEs for center-decorated structures (FIG. 13A) and for Delaunay-decorated structures (FIG. 13B). Overlaid on the SVEs are the scatterer configurations.

Figure 14:
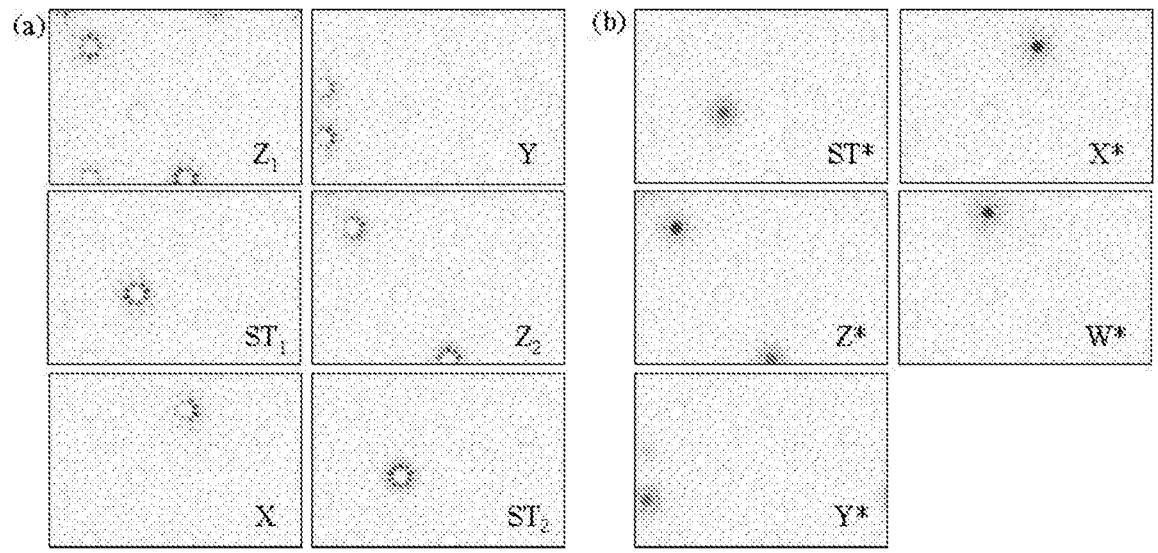

FIGS. 14A&B show representative examples of effectively localized states in center decorated structures. FIG. 14A shows examples of states that have electric field concentrated in the dielectric component (i.e., within scatterers). FIG. 14B shows examples of states that have electric field concentrated in the air component (i.e., between scatterers). Blue/red/white corresponds to negative/positive/zero field, respectively.

Figure 15:
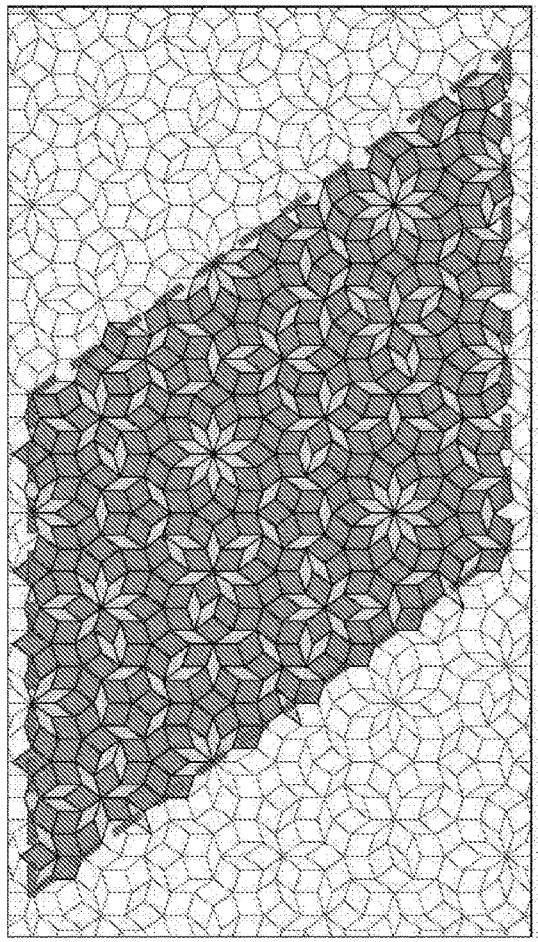
Figure 15:
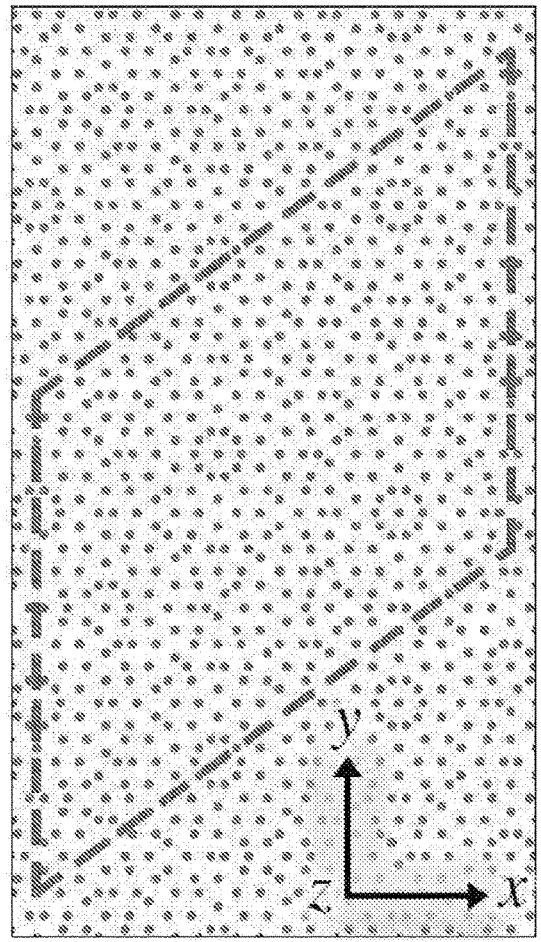

FIG. 15 shows an example of a dielectric structure (right panel) derived from the tiling shown in the left panel. The unit cell is outlined in dashed red lines. Dielectric cylinders (filled in with green) have axes oriented along the z-axis, which points out of the page.

DESCRIPTION OF THE INVENTION

This invention relates generally to the field of quasicrystalline structures.

We study a continuum of photonic quasicrystal heterostructures derived from local isomorphism (LI) classes of pentagonal quasicrystal tilings. These tilings are obtained by direct projection from a five-dimensional hypercubic lattice. We demonstrate that, with the sole exception of the Penrose LI class, all other LI classes result in degenerate, effectively localized states, with precisely predictable and tunable properties (frequencies, frequency splittings, and densities). We show that localization and tunability are related to a mathematical property of the pattern known as "restorability," i.e., whether the tiling can be uniquely specified given only a set of rules that fix all allowed clusters smaller than some bound.

The choice of orientational symmetry, quasiperiodicity, and the fundamental repeating units (e.g., tiles, atoms, molecules) does not uniquely specify a quasicrystal; there are infinitely many space-filling arrangements of the same repeating units, with the same symmetry and same support for their diffraction patterns [1-4]. See FIG. 1A. They can be grouped into local isomorphism (LI) classes; two quasicrystals are in the same LI class if, and only if, any local configuration of the repeating units found in one can be found with the same frequency in the other.

Provided herein is an investigation of the photonic properties of pentagonal quasicrystal heterostructures across a continuous spectrum of LI classes composed of different arrangements of the same obtuse and acute rhombi. We demonstrate that these heterostructures, though defect free, possess effectively localized states within their fundamental band gaps and that the frequencies, frequency splittings, spatial configuration, and concentration of the localized states can be precisely predicted and tuned in advance by varying the LI class and/or other parameters. This flexibility and control is advantageous in the design of optical cavities for use as radiation sources [5] or sensors [6]. Existing methods for generating localized stated [7] through disorder (defects) have the challenge of identifying defect arrangements that minimize the interference between defects and, at the same time, enabling the ability to select the frequency splittings. At present, no such methodology exists for photonic quasicrystals. (For a review, see Ref. [8].)

We show that the existence and tunability of these states is related to the fact that, except for a countable subset of measure zero, the continuous spectrum of LI classes is not restorable [9, 10]. A restorable tiling can be uniquely specified given only a set of rules that fix all allowed clusters smaller than some bound; a well-known example is the Penrose tiling [11], which satisfies J. Conway's "town theorem" [12], a specific type of restorability. Conversely, non-restorable means that there exist local configurations of rhombi whose density can be made arbitrarily small by continuously scanning through the spectrum of LI classes. We find that it is these configurations that become the tunable localization sites.

Tilings and definitions—The tilings are obtainable as direct projections from a five-dimensional hypercubic lattice or as duals to an overlapping set of five periodically spaced grids [13-15]. We use periodic approximants to compute the bandstructure and verify convergence with the level of approximant.

Figure 1:
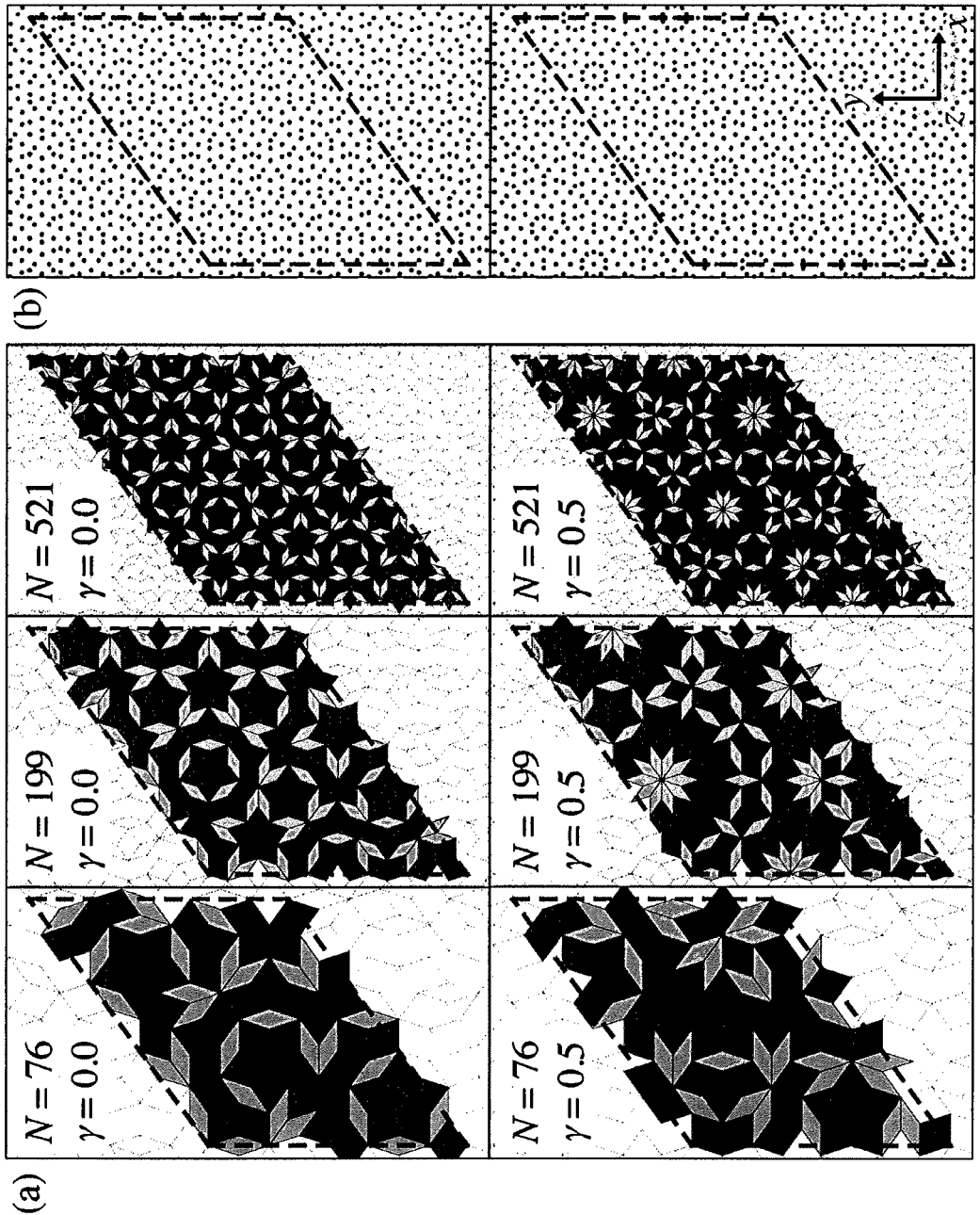
FIG. 1A shows examples of periodic approximants from two different LI classes with pentagonal symmetry (top to bottom) and from three different degrees of approximant (left to right). The spectrum of LI classes for these tilings can be labeled by a single number "γ" that varies continuously from 0 to 1. The two examples of LI classes are: γ=0 (top row) and γ=0.5 (bottom row). The number of points in the unit cell for each approximant is: N=76 (left column), N=199 (middle column), and N=521 (right column). The unit cell for each approximant is outlined in dashed red lines. The tiles that form the unit cell are filled in, with obtuse tiles filled in with green and acute tiles filled in with yellow. (Some of the unit-cell tiles extend beyond the dashed red lines, because we have chosen here to completely fill in tiles (without repeats) that occur at the boundary of the unit cell, instead of truncating them.)
FIG. 1B shows example of dielectric structures derived from the N=521 approximants in (a). Dielectric cylinders (filled in with green) have axes oriented along the z-axis, which points out of the page.

The approximants are generated using the "generalized dual method" described in Refs. [15] and [16], with one modification: instead of $r_i$=(cos $2\pi i/5$, sin $2\pi i/5$), the star vectors are chosen as follows:

$$\check{r}_0 = (1,0), \check{r}_1 = (\cos 2\pi/5, \sin 2\pi/5),$$

$$\check{r}_2(n) = (-1, \tau_n^{-1}) \cdot (\check{r}_0, \check{r}_1),$$

$$\check{r}_3(n) = -(\tau_n^{-1}, \tau_n^{-1}) \cdot (\check{r}_0, \check{r}_1),$$

$$\check{r}_4(n) = (\tau_n^{-1}, -1) \cdot (\check{r}_0, \check{r}_1),$$

where $\tau_n = F_{n+1}/F_n$ (=1/1, 2/1, 3/2, 5/3, . . . ) and $F_n$ is the nth Fibonacci number ($F_0 = F_1 = 1$). Examples from different LI classes are shown in FIG. 1A. For the Penrose LI class, this procedure minimizes the density of defects—necessary to make the tilings periodic—to two mismatched edges per unit cell [17]. As n→∞: the approximants approach the ideal tiling; the number of vertices in the unit cell increases; $\tau_n \rightarrow (1+\sqrt{5})/2 \approx 1.618$, the golden ratio; and $\check{r}_i(n) \rightarrow r_i$, the star vectors of the ideal tiling. The tilings are composed of two types of rhombuses, both with the same edge length a, but one with interior angle $2\pi/5$ ("obtuse") and the other $2\pi/10$ ("acute"). In the limit n→∞, the ratio of the number of obtuse rhombi to the number of acute rhombi is equal to $\tau$ for all tilings; hence, in the n→∞ limit, all tilings have the same number density, i.e., the same number of vertices per unit area.

The displacement of the ith grid from the origin is the phase $\gamma_i$, and the sum of the phases $\gamma = \Sigma_{i=0}^{4} \gamma_i$ labels the LI class of the tiling. Two tilings are locally isomorphic (up to inversion) if, and only if, the sum of their phases $\gamma = \Sigma_{i=0}^{4} \gamma_i$, $\gamma' = \Sigma_{i=0}^{4} \gamma'_i$ are related by $$|-\tfrac{1}{2} + \{\gamma\}| = |-\tfrac{1}{2} + \{\gamma'\}|, \qquad \text{(Equation 1)}$$

where {γ} denotes the fractional part of γ. The distinct values of γ lie within the interval [0, 0.5]; γ=0 corresponds to the Penrose tiling. Any γ can be mapped to an equivalent one γ' within the interval [0, 0.5]] via $$\gamma'=\frac{1}{2}-|-\frac{1}{2}+\{\gamma\}|.$$ (Equation 2)

Moreover, γ, γ'ε[0, 0.5] and γ'≠γ', then γ is not locally isomorphic to γ'.

Figure 2:
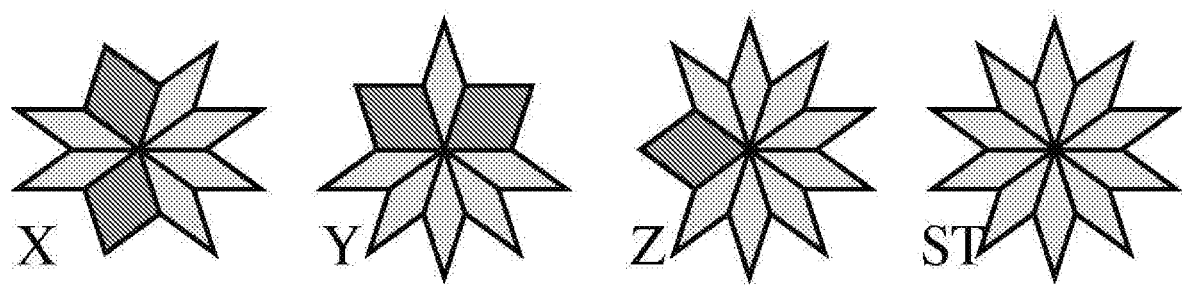
FIG. 2 shows the four special vertex environments.
Figure 3:
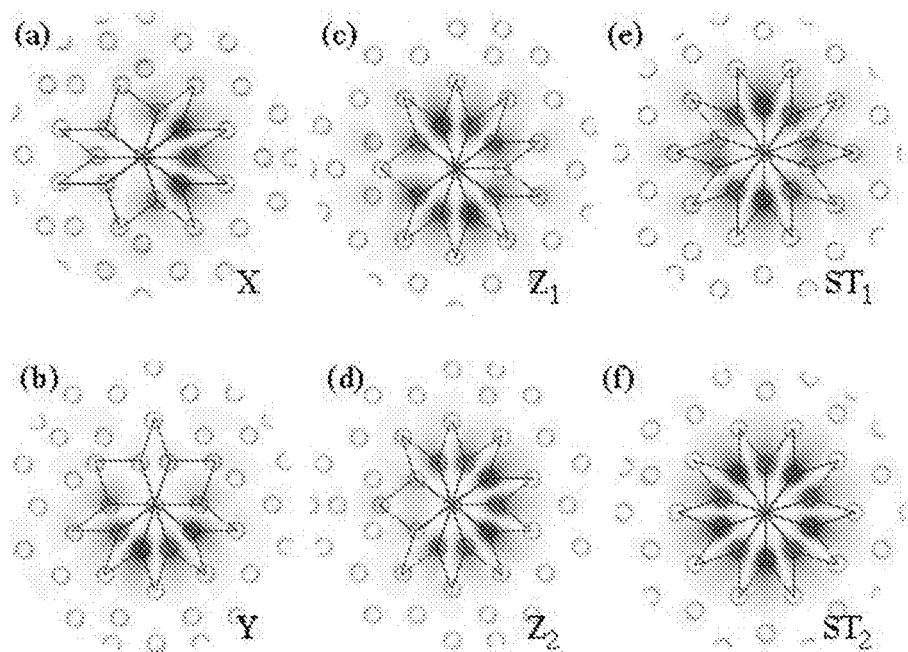
FIG. 3 shows a representative electric field distribution for the six observed types of effectively localized states. Blue/red/white corresponds to minimum/maximum/zero power for a given state. Contours of dielectric cylinders are shown, and the vertex environments are overlaid (see FIG. 2). (a) X, (b) Y, (c) $Z_1$, (d) $Z_2$, (e) $ST_1$, and (f) $ST_2$.

A vertex environment is a configuration of tiles that shares a common vertex. There are sixteen distinct vertex environments (up to rotation), and every LI class has a characteristic distribution of vertex environments (see Refs. [16] or [18]). The X, Y, Z, and ST vertices (using the notation of Refs. [13, 14, 19]) play an important role in our discussion. They are shown in FIG. 2, and we refer to them as special vertex environments (SVEs).

Setting up bandstructure calculation—We compute the photonic bandstructure of dielectric heterostructures constructed by placing, on the tile vertices and oriented normal to the tiling plane, an array of parallel, infinitely long cylindrical rods with dielectric constant 11.56 (silicon) and radius 0.18a (filling fraction ~12.5%) in a background of air. The same radius (equivalently, same filling fraction) is chosen for all structures to allow for fair comparison. Examples of such dielectric structures are shown in FIG. 1B.

Maxwell's equations are solved for states with transverse magnetic (TM) polarization, i.e., with the electric field oriented parallel to the cylindrical axis (the z-axis in FIG. 1B). The TM bandstructure is calculated using a supercell approximation and the plane-wave expansion method [20, 21]. Spatial resolution of the unit cell is chosen to be 512×512. For N=521 approximants, the frequencies computed at this resolution differ by less than 0.1% of those computed at 1024×1024 resolution. We compute the lowest 1.1×N bands, which reliably contains the first sizeable bandgap.

For quasicrystals, the photonic bandgaps and the neighboring bands are known to be highly isotropic [22, 23]. Therefore, we simplify our analysis by restricting our computation of spectra to the Γ=(0, 0) and M=(b, 0) symmetry points, where b is one of the basis vectors of the reciprocal lattice. These are defined for the hexagonal first Brillouin zone, corresponding to the rhombic unit cell of the approximant.

Results—Whenever a SVE appears in a tiling, the TM bandstructure contains states in which the electric field is highly concentrated on the SVE, either on one isolated site or on many sites. FIG. 3A-F shows representative examples of these states on isolated sites.

Take one of these states and let r be the radial distance from the central vertex. We observe that the energy density u(r) (the square of the field) peaks around r≈a—where the first nearest neighbors are located—then drops to ≤0.1% of the peak by around r≈2a. The field thus appears to be highly localized on the SVE. However, because some states are observed to have support on multiple sites, they may not be localized in the strict sense but, instead, may be multifractal, critical states [24, 25]. Determining whether this is the case is worthy of further investigation. Here, we describe the states as effectively localized.

The number of effectively localized states is directly related to the number of SVEs. We empirically observe that there is one state for every X vertex (FIG. 3A), one for every Y (FIG. 3B); two for every Z (FIG. 3C and FIG. 3D); and three for every ST (FIG. 3E and FIG. 3F; there are two orthogonal states that look like FIG. 3E). Thus, the total number of effectively localized states $n_{loc}$ is given by $$n_{loc}=N_X+N_Y+2N_Z+3N_{ST},$$ (Equation 3)

where $N_V$ is the number of SVEs of type V. For different renditions from the same LI class, the number will differ.

In the infinite-system limit, the fraction of effectively localized states for LI class γ is given by $$\varphi(\gamma)=F_X(\gamma)+F_Y(\gamma)+2F_Z(\gamma)+3F_{ST}(\gamma),$$ (Equation 4)

where $F_V$ is the density of SVEs of type V, shown in FIG. 4A. We plot φ(γ) in FIG. 4B. All of our numerical results thus far, which are summarized below, support the counting of effectively localized states according to Equation 3 and Equation 4. The SVEs that are composed of a greater number of acute rhombi and which are more symmetric (i.e., Z and ST) have a larger number of states per SVE.

Figure 5:
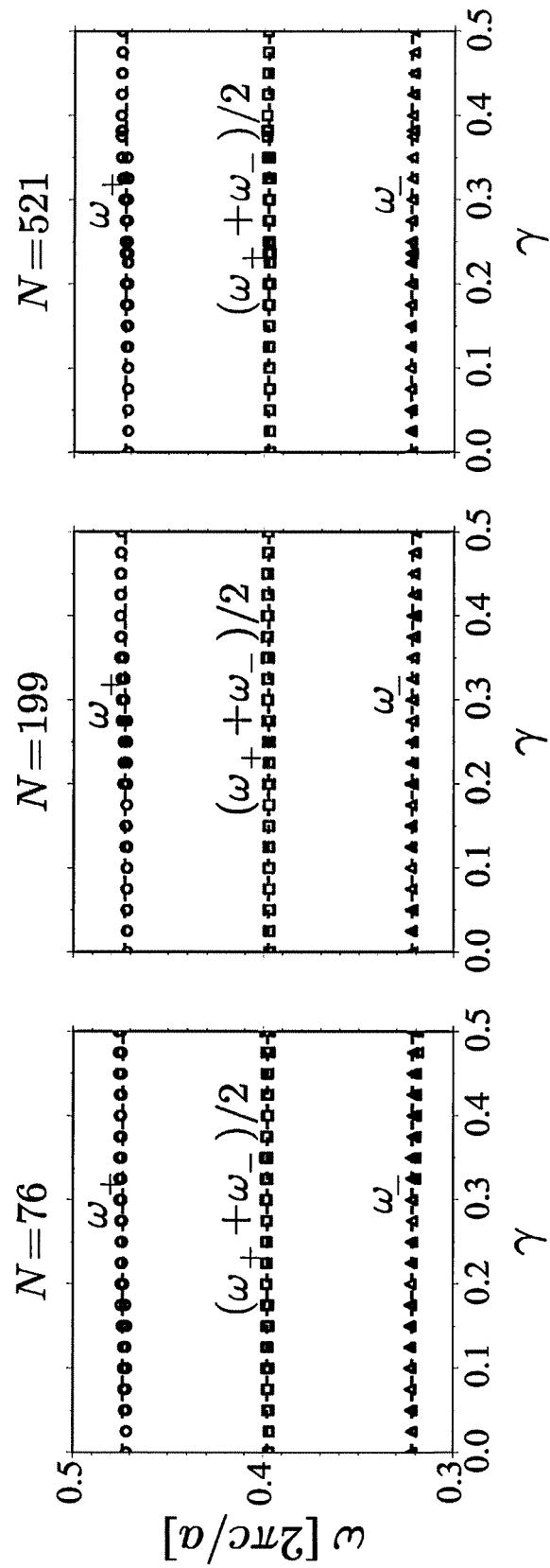
FIG. 5 show Upper band edge frequency $\omega+\equiv\omega^L_N$ (blue circles, top), lower band edge frequency $\omega_-$ and $\omega_{N-n}$loc (red triangles, bottom), and the central frequency (green squares, middle), versus γ. As discussed in the text, ω+ and ω− correspond to the upper and lower edges, respectively, of the fundamental bandgap. Dashed lines represent the aver-age value for a given curve. Each panel is a different degree of approximant, with increasing degree from left to right. The number of points in the unit cell is shown above each panel (N=76, 199, 521).

Let $\omega_i^L$, $\omega_i^H$ be the lower and upper frequencies of the ith band. It is useful to define, for a given tiling, the upper band edge frequency $\omega_+$ and the lower band edge frequency $\omega_-$ as follows:

$$\omega_+=\omega^L_N, \omega_-=\omega^H_{N-n_{loc}}$$ (Equation 5)

where N is the number of vertices in the unit cell. FIG. 5 shows $\omega_+$, $\omega_-$, and their average, plotted for several samples from different LI classes γ, for different degrees of approximants. Several observations can be made:

First, $\omega_+$ and $\omega_-$ do not change significantly versus the degree of the approximant, characterized by N. This indicates that these quantities quickly converge to the values of the ideal, infinite system.

Second, $\omega_+$ and $\omega_-$ remain approximately constant versus γ. For the Penrose LI class, the region between $\omega_-$ and $\omega_+$ is called the fundamental bandgap. Extending this definition to all LI classes, we find that the effectively localized states counted by Equation 3 are high-frequency states lying within the fundamental bandgap.

Finally, the fraction of these states appears to stay constant, as the degree of the approximant increases. This is contrary to what we would expect if these effectively localized states arose from defects. We thus conclude that these effectively localized states are not defects, but are, rather, robust states that arise due to the SVEs.

Figure 6:
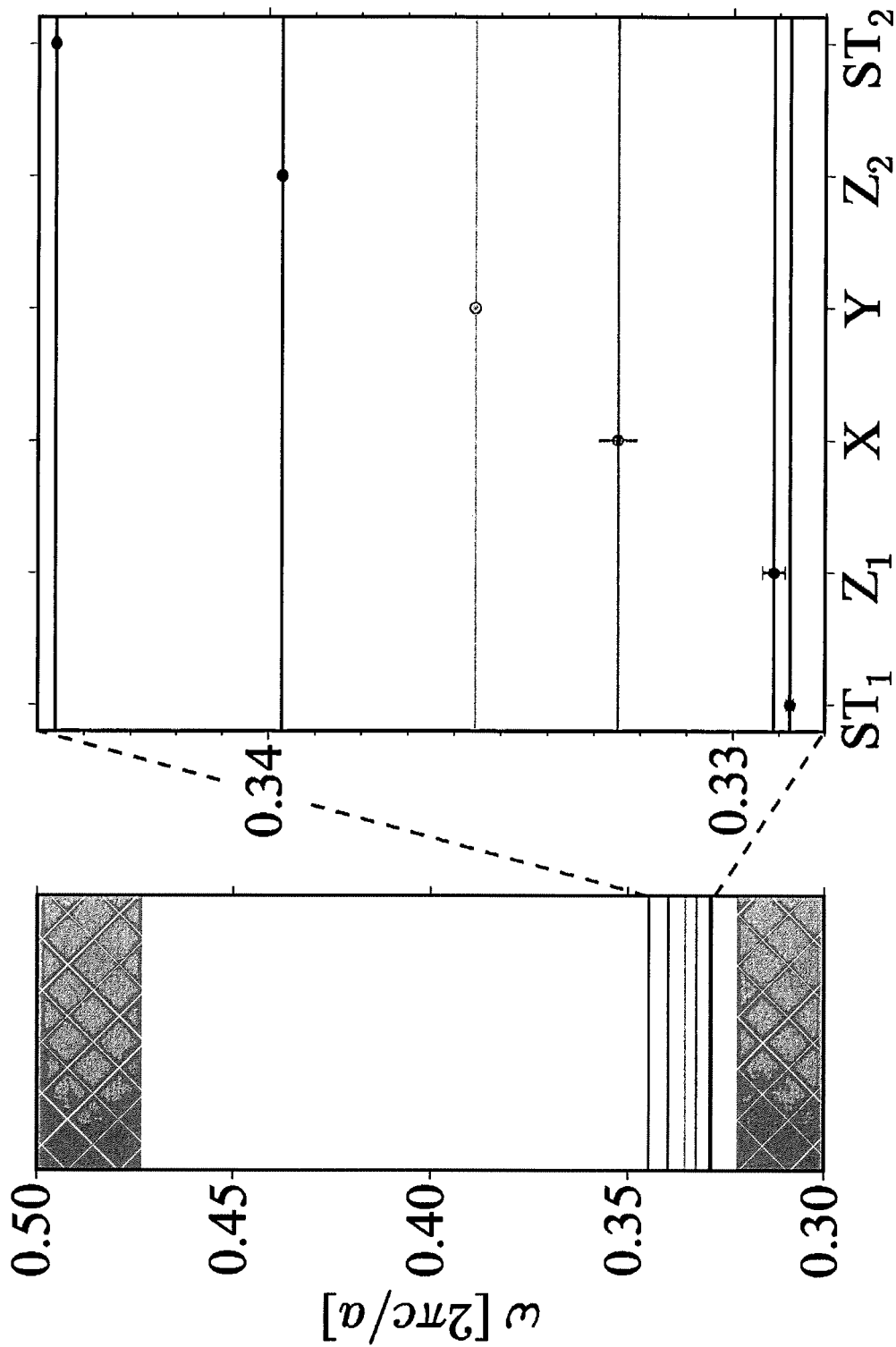
FIG. 6 shows the average frequencies of effectively localized states (shown in FIG. 3). In the left panel, the shaded, solid regions at the upper and lower ends represent the continuum of states adjacent to the fundamental bandgap. The right panel, which is a blown up portion of the left panel around the effectively localized states, identifies which effectively localized states correspond to the different frequencies.

FIG. 6 shows the average midband frequency for each type of state. Within uncertainties, all states of a given type have the same frequency (i.e., are degenerate), and frequencies for different types do not overlap. This indicates that each type has a characteristic frequency.

We also observe that the characteristic frequencies do not vary significantly versus γ, which suggests that these states are primarily attributable to the presence of SVEs and not to the global structure of the tiling. This supports a hypothesis, based on the study of one unspecified LI class [26-28], that these states can be described as local resonances between closely neighboring scatterers that are arranged in highly symmetric configurations. Further evidence is that the four SVEs have the largest numbers of adjacent acute rhombi (at least four); all other vertex environments contain fewer than four adjacent acute rhombi.

From these observations, we expect the TM spectrum around the fundamental bandgap varies with γ according to FIG. 7A. We also expect the outer bandgap—the width of the gap between bands N and N+1, normalized by the midgap frequency—varies with γ according to FIG. 7B.

We thus discover that the Penrose LI class is exceptional for being the only class with no effectively localized TM states; as a consequence, it has the largest outer bandgap. All other LI classes have, generically, effectively localized TM states within the fundamental bandgap with predictable and tunable degeneracies (FIG. 4B) and frequencies (FIG. 6) and are related to the presence of SVEs. Our initial studies using other choices of dielectric decoration show qualitatively the same results, although some choices also produce effectively localized states within the air component of the heterostructure.

Discussion—Our results reveal a deep connection between the localized states and restorability. A quasicrystal pattern is restorable if it can be uniquely specified given only a set of rules that fix the allowed clusters within a circle whose radius is smaller than some bound [9]. The bound can be used to derive a lower limit on the density of configurations of any given size, including the special vertex environments (SVEs). The restorable LI classes [10, 16] correspond to $\gamma=n\tau(n\in Z)$, a countable subset of measure zero in the spectrum of all LI classes described by the continuous parameter $\gamma$. The localization sites occur with non-negligible density and, hence, may be multifractal critical states [24, 25] rather than localized in the strict sense.

Figure 4:
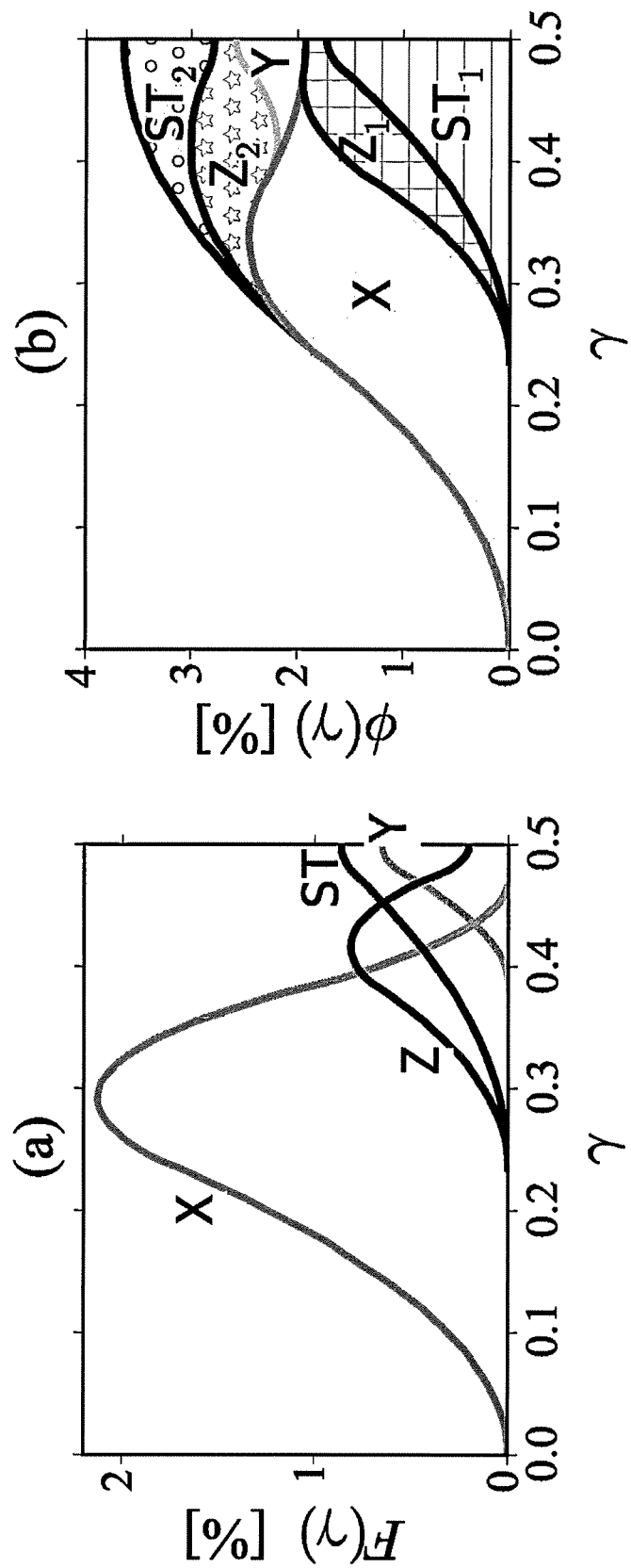
FIG. 4A show the density F of the four special vertex environments (shown in FIG. 2), versus LI class γ.
FIG. 4B show Expected fraction φ of special states (shown in FIG. 3) versus LI class γ.

By contrast, within the uncountable set of nonrestorable LI classes, $\gamma$ may be varied such that the densities of some configurations can be made arbitrarily small, as illustrated in FIG. 4 for the case of SVEs. If the configuration is the site of a localized state (say, with field falling away exponentially from the center, as suggested by the simulations for SVEs), then the state is strictly localized in the limit that the density approaches zero.

While our study is only in the case of vertex environments, the same may apply for larger configurations—that is, there may be larger clusters of obtuse and acute rhombi that are sites of localized states and there may be sequences of LI classes for which their density approaches zero. Similar thresholds almost surely apply to LI classes obtained by extensions of the dual method that are parameterized by additional degrees of freedom aside from $\gamma$ (such as lattices dual to quasiperiodic pentagrids), and it may be worth studying such examples for the purpose of applications. The study here, though, establishes the basic principles.

EXAMPLES

The following examples are provided in order to demonstrate and further illustrate certain preferred embodiments and aspects of the present invention and are not to be construed as limiting the scope thereof.

Example 1

Effectively Localized States: Localized Versus Extended

This Example reports on two studies that explore to what extent the effectively localized states are truly extended or localized. The studies presented here do not lead to definitive conclusions, but are intended to inform and guide how further studies might be performed. A couple notes on terminology: Because only effectively localized states are discussed here, we drop the effectively localized" descriptor. Moreover, all states of a given type (e.g., $ST_1$ type, $Z_1$ type) are said to form a miniband.

Observing that the states within a miniband are degenerate would support the hypothesis that the states are localized and not extended. In Example 2, we examine whether the states within a miniband have a measurable difference in frequency. We identify and estimate the uncertainty stemming from discretization of the unit cell to numerically solve Maxwell's equations for the photonic bandstructure. The band width (i.e., the difference between the maximum and minimum eigenfrequencies in a miniband) is also estimated. We observe that the uncertainty is typically larger than the band width and, therefore, the frequencies of states within the miniband cannot be discriminated from one another (if the differences are theoretically nonzero). The results are also consistent with the states forming a miniband being degenerate in frequency.

There are some effectively localized states in which the electric field is concentrated on a single SVE site. We refer to such states as single site (SS) states. There are other effectively localized states in which the field is distributed over multiple SVE sites. Such states are referred to as multiple site (MS) states. A characteristic feature of a localized state is an exponential falloff of the energy density from the localized site. In Example 3, we check whether the exponential falloff is observed in examples of SS and MS states to determine to what extent the states are localized. The results show that both SS and MS states are composed of exponentially localized field configurations, which are centered on individual SVE sites.

Example 2

Degenerate States in Minibands

To determine whether the frequencies of a set of states forming a miniband can be discriminated from one another, we need an estimate of the numerical uncertainty stemming from the procedure used to compute the bandstructure. In this Example, we estimate the uncertainty that stems from the fact that, when numerically solving Maxwell's equations, an initial step is to discretize the unit cell into a grid of pixels.

The number of pixels N×N per unit cell, which we call the resolution, is a simulation parameter that can be changed. In the N→∞ limit (assuming the pixels are uniformly distributed in the unit cell), the pixelated unit cell approaches the ideal unit cell. However, for all simulations, N is necessarily finite. Therefore, the discretized unit cell is always an approximation of—and never equal to—the analytically defined unit cell. This approximation leads to some amount of numerical uncertainty in the computed values of frequency $\omega$. We call this the uncertainty from resolution and denote it by $d\omega$.

We denote the frequency range of a miniband (i.e., the difference between the largest and smallest frequencies in a miniband) by $\Delta\omega$ and call it the band width. To resolve the frequency differences between states within a miniband—if the states are not degenerate—the uncertainty $d\omega$ must be less than $\Delta\omega$, i.e., $$\Delta\omega > d\omega \qquad \text{(Equation 6)}$$

However, as we show below, our estimates indicate that $d\omega/\Delta\omega \sim 10^2$. Therefore, within the uncertainties, the observations are consistent with the states forming a miniband being degenerate in frequency.

Uncertainty from Resolution

We obtain an estimate of the uncertainty from resolution d! using the following procedure: We first choose an LI class $\gamma$ and make a rendition (i.e., choose a set of phases $\gamma_i$ and degree of approximant). Next, we compute the bandstructure of this rendition, first using 512×512 pixels in the unit cell. Let $\omega^i_{512}$ denote the ith largest eigenfrequency. We then compute the bandstructure of the same rendition, now using 1024×1024 resolution. Let $\omega^i_{1024}$ denote the ith largest eigenfrequency computed at 1024×1024 resolution. The relative change $\delta\omega^i$ in the computed values of the frequencies $$\delta\omega^i \equiv \frac{\omega^i_{521} - \omega^i_{1024}}{\omega^i_{1024}} \quad \text{(Equation 7)}$$

gives an estimate of $d\omega/\omega$.

We compute $\delta\omega^i$ for all of the states lying in the minibands. We repeat this calculation for three LI classes ($\gamma=0$: 42; 0:45; 0:50), three renditions from each LI class, and six values of the dielectric constant $\varepsilon$. The results are shown in FIG. 8.

We observe that all of the values of $\delta\omega^i$ are less than 0:3%. This upper bound gives a conservative estimate of $d\omega/\omega$:

$$d\omega/\omega \sim 3 \times 10^{-3} \quad \text{(Equation 8)}$$

Using a typical frequency of these states $\omega \sim 0:3$ (in units of $2\pi c/a$), we obtain an estimate of the absolute uncertainty from resolution $d\omega$ (the main result):

$$d\omega = (d\omega/\omega)\omega \sim (3 \times 10^{-3})0.3 \sim 10^{-3}. \quad \text{(Equation 9)}$$

There are some additional observations that can be made from FIG. 8: The relative change in frequency $\delta\omega^i$ is always positive. Therefore, as the resolution increases, the computed values of $\omega$ systematically decrease. Such a systematic trend is consistent with the values of $\omega$ converging from above as the resolution increases. We also observe that, for the same dielectric constant, there does not appear to be any systematic difference in $\delta\omega^i$ between different LI classes or between different renditions from the same LI class. However, as $\varepsilon$ increases, there appears to also be an increase (on average) in $\delta\omega^i$.

Band Width

We now turn to an estimate the band width $\Delta\omega$. Our procedure is as follows: We first choose an LI class $\gamma$, make a rendition (i.e., choice of degree of approximant and choice of phases $\gamma^i$ whose sum is $\gamma$), and compute the bandstructure. The bandstructure will, in general, contain minibands. For each miniband, the band width $\Delta\omega$ is computed by subtracting the minimum frequency in the miniband from the maximum frequency in the miniband. The band widths are plotted in FIG. 9, where different rows correspond to the different minibands. Each position along the horizontal axis corresponds to one rendition. Each miniband is divided into subpanels according to the number of SVEs n in the rendition of the miniband type (e.g., for the $ST_1$ miniband shown in the topmost plot, n is the number of $ST_1$ sites). Within each subpanel, the value of n is shown, and the renditions are ordered according to increasing $\Delta\omega$.

The minibands—with the possible exception of the X miniband—have a band width $\Delta\omega$ that does not systematically increase as the number of SVEs increases. Moreover, it appears that $$\Delta\omega \sim 10^{-4}. \quad \text{(Equation 10)(4.15)}$$

(The ST2 band is an exception, which has band width $10^{-5}$.)

We have estimated the uncertainty due to finite resolution (pixelization) to be $d\omega \sim 10^{-3}$ and the band width to be $\Delta\omega \sim 10^{-4}$. Our estimates show that the uncertainty is greater than the band width. Thus, the frequencies of different states within a given miniband cannot be discriminated from one another. The results are consistent with the states forming a miniband being degenerate in frequency. Initial studies using increased resolutions up to 2048×2048 show that $\Delta\omega$ decreases with resolution, which is also consistent with the minibands comprising degenerate states.

Example 3

Exponentially Localized Electric-Field Energy Density

A characteristic feature of a localized state is an exponential falloff of the energy density from the localized site. In this Example, we check whether the exponential falloff is observed in examples of SS and MS states to determine to what extent the states are localized. Three states are examined. The states are frequency eigenstates of the same rendition (i.e., the same phases $\gamma_i$ and same approximant) of LI class $\gamma=0:45$.

We first establish notation. Let $E^2(r)$ be the electric-field energy density of a frequency eigenstate from a miniband, where r denotes the position in the unit cell. Let x denote the position of the central vertex of one of the sites of the SVE type corresponding to the miniband. We compute the maximum value of the energy density $E^2(r)$ around a circle of radius r centered at x $$\max_{r=|r-x|}\{E^2(r)\}, \quad \text{(Equation 11)}$$

as well as the average value of the energy density around the circle of radius r centered at x:

$$\underset{r=|r-x|}{\text{avg}}\{E^2(r)\} \quad \text{(Equation 12)}$$

The first state we consider is an $ST_1$ MS state. Its electric field distribution E(r) is shown in the left panel of FIG. 10. There are three ST sites in this rendition and the field is non-negligible on each site. For illustrative purposes, we show the quantities defined in Equation 11 and Equation 12 evaluated (right panel of FIG. 10) at two of the three ST sites. The maximum energy density at distance r, computed according to Equation 11, is shown as red solid lines versus r. The average energy density at distance r, computed according to Equation 12, is shown as black, dotted lines. Both quantities have been normalized so that the peak value is set to one.

In FIG. 10, we observe that the maximum and average values of $E^2$ peak around $r/a \approx 1$, which is where the first nearest neighbors are located. The values drop to $\leq 1\%$ of the peak values by $r/a \approx 2$ and $\leq 0.01\%$ of the peak values by $r/a \approx 3$. There appears to initially be a log-linear falloff as r/a increases from r/a=1. There is then a attening around r/a=2, which roughly corresponds to the positions of the second nearest neighbors. Finally, at r/a=2, there appears to a be a faster than log-linear falloff. The curves appear to be virtually identical for the two sites. The observed log-linear behavior and the observed similarities of the curves for the two ST sites both suggest that the energy density is exponentially localized on individual ST sites. For both sites, the background energy density, which we take to be the peak energy density in a region at the top left of the unit cell far removed from the ST sites, is $\sim 10^{-6}$ (on the normalized scale).

The analysis is repeated for an ST2 SS state. Its electric field distribution E(r) is shown in the left panel of FIG. 11. The right panels here contain the same quantities that were evaluated above in the right panels of FIG. 10. We consider the energy density profiles around the same two ST sites as before. In FIG. 11, we continue to observe a log-linear falloff of the energy density. The degree of attening around $r/a \approx 2$ is less than for the $ST_1$ states. Instead of the second resonance that was observed at $r/a \approx 2$ in FIG. 10, there is now a second resonance around $r/a \approx 2.5$. Interestingly, despite the fact that the power of E(r) is largely concentrated around Site 1 and not on Site 2, the normalized profiles of the curves appear to be virtually identical. As with the $ST_1$ states, the log-linear behavior and similarities of the curves for the two ST sites suggest that the energy density is exponentially localized on individual ST sites. For Site 1, the background energy density, which is computed in the same way as it was for the $ST_1$ MS state, is $\sim 10^{-6}$ (on the normalized scale). For Site 2, the background is $\sim 10^{-4}$.

The third state we examine is an X MS state. Its electric field distribution E(r) is shown in the left panel of FIG. 12. There are four X sites in this rendition and the field is non-negligible on each site. We repeat the procedure to compute Equation 11 and Equation 12 for two of the sites, the results of which are contained in the right panel of FIG. 12. There are some similarities with the $ST_1$ and $ST_2$ states. For example, (i) the energy density peaks at the position of the first nearest neighbors $r/a=1$, (ii) there is a falloff for $r/a>1$ that is initially log-linear, and (iii) the curves are virtually identical for the two X sites. There are also some differences. There appears to be both a resonance at $r/a \approx 2$ and a resonance at $r/a \approx 2:5$. Moreover, the curves turn upward around $r/a \approx 2:75$. The midpoint between the two sites lies approximately at $r/a \approx 2:5$, which suggests that the upturn in the energy density is simply due to the fact that the two X sites are adjacent. Altogether, the observations for the X sites are consistent with the energy density being exponentially localized on individual X sites. For both sites, the background energy density, which we take to be the peak energy density in a region at the bottom left of the unit cell far removed from the X sites, is $\sim 10^{-5}$ (on the normalized scale).

The above analysis suggests that the frequency eigenstates—both SS and MS—are composed of exponentially localized configurations centered on individual SVE sites.

Example 4

Photonic Bandstructure Calculation

We compute the photonic bandstructure of dielectric heterostructures constructed by placing, on the tile vertices and oriented normal to the tiling plane, an array of parallel, infinitely long cylindrical rods with dielectric constant 11:56 (silicon) and radius 0:18a (filling fraction $\sim 12.5\%$) in a background of air. The same radius (equivalently, same filling fraction) is chosen for all structures to allow for fair comparison. An example of such a dielectric structure is shown in FIG. 15.

Maxwell's equations are solved for states with transverse magnetic (TM) polarization, i.e., with the electric field oriented parallel to the cylindrical axis (the z-axis in FIG. 15). The TM bandstructure is calculated using a supercell approximation and the plane-wave expansion method [20, 21]. Spatial resolution of the unit cell is chosen to be 512×512 pixels. For N=521 approximants, the frequencies computed at this resolution differ by less than 0.3% of those computed at 1024×1024 resolution. We compute the lowest 1:1×N bands, which reliably contains the first sizeable bandgap.

For quasicrystals, the photonic bandgaps and the neighboring bands are known to be highly isotropic [22, 23]. Therefore, we simplify our analysis by restricting our computation of spectra to the $\Gamma=(0; 0)$ and M=(b; 0) symmetry points, where b is one of the basis vectors of the reciprocal lattice. These are defined for the hexagonal first Brillouin zone, corresponding to the rhombic unit cell of the approximant. (Because the basis vectors of the rhombic unit cell are not equal in magnitude, the hexagonal first Brillouin zone is attened/stretched along one of the symmetry directions.)

Example 5

Decorations and Air-Localized States

In this Example, we present results showing that the presence of effectively localized states persists upon changing the decoration of the tiling. Two further choices of decoration are studied, one in which the scatterers are placed at tile centers, and one in which the scatterers are placed at the centroids of the Delaunay-triangulated tiling. The latter construction can be performed simply as follows: Take a tile (fat or skinny) and draw perpendicular bisectors from each edge, extending into the interior of the tile, until the bisectors each encounter another bisector. (Because the rhombus tiles are not squares, there will never be a point of intersection between more than two bisectors). At that point of intersection, place a scatterer. By this construction, every tile will contain two scatterers.

Figure 13:
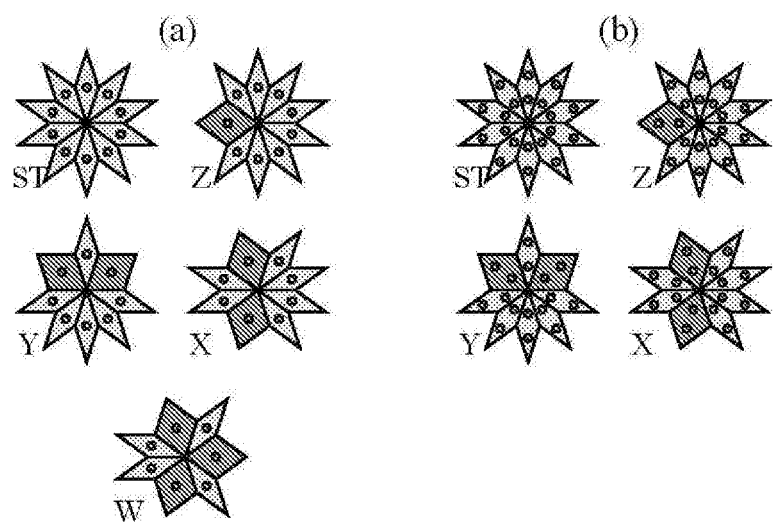

Following the same procedure as discussed in Example 4 to calculate the TM bandstructure, we find that both center-decorated structures and Delaunay-decorated structures have effectively localized states. The X, Y, Z and ST vertex environments continue to be SVEs. The center-decorated structures have one additional SVE in the W vertex environment. The decorated SVEs are shown in FIG. 13. We also find analogous counting formulae for the new structures.

We continue to observe effectively localized states lying in the fundamental bandgap in which the field is concentrated in the dielectric component. However, there is an additional novelty in the center-decorated structures. There are states in which the field is concentrated in the air component. Representative examples of these "air-localized states" are shown in FIG. 14B, where they are labeled with asterisks (*). The frequencies of the air-localized states lie near the upper edge of the fundamental bandgap. This is intuitively expected; typically, states below the fundamental bandgap have an electric field distribution that is concentrated in the dielectric component, whereas states above the bandgap have field concentrated in the air component.

Although the invention has been described with reference to these preferred embodiments, other embodiments can achieve the same results. Variations and modifications of the present invention will be obvious to those skilled in the art and it is intended to cover in the appended claims all such modifications and equivalents. The entire disclosures of all applications, patents, and publications cited above, and of the corresponding application are hereby incorporated by reference.

REFERENCES

1. Levine, D. and Steinhardt, P. J. (1984) "Quasicrystals: A New Class of Ordered Structures," *Phys. Rev. Lett.* 53(26), 2477-2480.
2. Levine, D. and Steinhardt, P. J. (1986) "Quasicrystals. I. Definition and Structure," *Phys. Rev. B* 34(2), 596-616.
3. Socolar, J. E. S. and Steinhardt, P. J. (1986) "Quasicrystals. II. Unit-Cell Configurations," *Phys. Rev. B* 34(2), 617-647.
4. Steinhardt, P. J. and DiVincenzo, D. P. (1999) *Quasicrystals: The State of the Art*, World Scientic, Singapore.

5. Altug, H. et al. (2006) "Ultrafast Photonic Crystal Nanocavity Laser," *Nat. Phys.* 2, 484.
6. El-Kady, I. et al. (2006) "Application of Photonic Crystals in Submicron Damage Detection and Quantification," *Appl. Phys. Lett.* 88(25), 253109.
7. Chan, Y. S. et al. (1998) "Photonic Band Gaps in Two Dimensional Photonic Quasicrystals," *Phys. Rev. Lett.* 80(5), 956-959.
8. Vardeny, Z. V. et al. (2013) "Optics of Photonic Quasicrystals," *Nat. Photonics* 7, 177.
9. Levitov, L. S. (1988) "Local Rules for Quasicrystals," *Communications in Mathematical Physics* 119, 627-666.
10. Ingersent, K. and Steinhardt, P. J. (1990) "Matching Rules and Growth Rules for Pentagonal Quasicrystal Tilings," *Phys. Rev. Lett.* 64(17), 2034-2037.
11. Penrose, R. (1974) "The Role of Aesthetics in Pure and Applied Mathematical Research," *Bulletin of the Institute of Mathematics and Its Applications* 10, 266-271.
12. Gardner, M. (1972) "Mathematical Games," *Sci. Am* 226, 115.
13. de Bruijn, N. G. (1981) "Lambda Calculus Notation with Nameless Dummies, a Tool for Automatic Formula Manipulation, with Application to the Church-Rosser Theorem," *Indagationes Mathematicae (Proceedings)* 84, 39.
14. de Bruijn, N. G. (1981) "Algebraic Theory of Penrose's Non-Periodic Tilings of the Plane. II," *Indagationes Mathematicae (Proceedings)* 84(1), 53-66.
15. Socolar, J. E. S. et al. (1985) "Quasicrystals with Arbitrary Orientational Symmetry," *Phys. Rev. B* 32(8), 5547-5550.
16. Lin, C. et al. (2017) "Corrigendum: Hyperuniformity Variation with Quasicrystal Local Isomorphism Class," *J. Phys.: Condens. Matter* 29(47), 479501.
17. Entin-Wohlman, O. et al. (1988) "Penrose Tiling Approximants," *Journal of Physics France* 49(4), 587-598.
18. Zobetz, E. and Preisinger, A. (1990) "Vertex Frequencies in Generalized Penrose Patterns," *Acta Crystallogr Sect. A* 46(12), 962-970.
19. Pavlovitch, A. et al. (1989) "Statistics of 'Worms' in Penrose Tilings," *J. Phys. A: Math. Gen.* 22(20), 4347.
20. Joannopoulos, J. D. et al. (2011) *Photonic Crystals: Molding the Flow of Light*, Princeton University Press.
21. Johnson, S. G. and Joannopoulos, J. D. (2001) "Block-Iterative Frequency-Domain Methods for Maxwell's Equations in a Planewave Basis," *Opt. Express* 8(3), 173-190.
22. Rechtsman, M. C. et al. (2008) "Optimized Structures for Photonic Quasicrystals," *Phys. Rev. Lett.* 101(7), 073902.
23. Florescu, M. et al. (2009) "Complete Band Gaps in Two-Dimensional Photonic Quasicrystals," *Phys. Rev. B* 80(15), 155112.
24. Tokihiro, T. et al. (1988) "Exact Eigenstates on a Two-Dimensional Penrose Lattice and Their Fractal Dimensions," *Phys. Rev. B* 38(9), 5981-5987.
25. Repetowicz, P. et al. (1998) "Exact Eigenstates of Tight-Binding Hamiltonians on the Penrose Tiling," *Phys. Rev. B* 58(20), 13482-13490.
26. Wang, K. (2006) "Light Wave States in Two-Dimensional Quasiperiodic Media," *Phys. Rev. B* 73(23), 235122.
27. Wang, K. (2007) "Structural Effects on Light Wave Behavior in Quasiperiodic Regular and Decagonal Penrose-Tiling Dielectric Media: A Comparative Study," *Phys. Rev. B* 76(8), 085107.
28. Wang, K. (2010) "Light Localization in Photonic Band Gaps of Quasiperiodic Dielectric Structures," *Phys. Rev. B* 82(4), 045119.

We claim:

1. A method for generating a three-dimensional dielectric quasicrystal heterostructure with a photonic bandstructure, comprising
   a) obtaining quasicrystal tilings, wherein the tilings are pentagonal quasicrystal tilings, wherein said pentagonal quasicrystal tilings are obtained as direct projections using a rhombic-icosahedron window from a five-dimensional hypercubic lattice, and
   b) generating a dielectric quasicrystal heterostructure from said quasicrystal tilings, wherein said dielectric quasicrystal heterostructure has a photonic bandstructure that contains degenerate, effectively localized states, lying inside a bandgap.

2. The method of claim 1, wherein said dielectric quasicrystal heterostructure of step b) is generated without introducing defects into the heterostructure.

3. The method of claim 1, wherein said degenerate, effectively localized states have precisely predictable and tunable properties.

4. The method of claim 3, wherein said precisely predictable and tunable properties are selected from the group consisting of frequencies, frequency splittings, and spatial configurations.

5. A method for generating two- and three-dimensional dielectric quasicrystal heterostructures with a controlled pre-selected bandgap properties, comprising:
   a) generating a family of distinct defect-free quasicrystal patterns with a pre-selected symmetry comprising pentagonal quasicrystal tilings, wherein said pentagonal quasicrystal tilings are obtained as direct projections using a rhombic-icosahedron window from a five-dimensional hypercubic lattice; and
   b) generating a dielectric quasicrystal heterostructures from said quasicrystal patterns wherein the said dielectric quasicrystal heterostructures have photonic band structures photonic band gaps spanning pre-selected frequencies and localized states at pre-selected frequencies inside the bandgap.

6. The method of claim 5, wherein said degenerate, effectively localized states have precisely predictable and tunable properties.

7. The method of claim 6, wherein said precisely predictable and tunable properties are selected from the group consisting of frequencies, frequency splittings, and spatial configurations.

* * * * *